United States Patent
Tagare

(10) Patent No.: US 6,919,831 B1
(45) Date of Patent: Jul. 19, 2005

(54) CIRCUIT, APPARATUS, AND METHOD FOR CONVERTING ANALOG SIGNALS INTO DIGITAL SIGNALS

(76) Inventor: Madhavi V. Tagare, 5770 Harder St., San Jose, CA (US) 95129

( * ) Notice: Subject to any disclaimer, the term of this patent is extended or adjusted under 35 U.S.C. 154(b) by 0 days.

(21) Appl. No.: 10/833,500

(22) Filed: Apr. 28, 2004

(51) Int. Cl.[7] .............................................. H03M 1/00
(52) U.S. Cl. ...................... 341/122; 341/131; 341/156
(58) Field of Search ................................. 341/143, 156, 341/159, 118, 131, 122; 178/18.06; 348/572; 330/9

(56) References Cited

U.S. PATENT DOCUMENTS

| | | | | |
|---|---|---|---|---|
| 3,829,853 A | * | 8/1974 | Freedman | 341/159 |
| 4,903,026 A | * | 2/1990 | Tiemann et al. | 341/131 |
| 5,122,800 A | * | 6/1992 | Philipp | 341/156 |
| 5,463,395 A | * | 10/1995 | Sawai | 341/156 |
| 5,495,077 A | * | 2/1996 | Miller et al. | 178/18.06 |
| 5,495,247 A | * | 2/1996 | Yamamoto et al. | 341/159 |
| 5,861,829 A | * | 1/1999 | Sutardja | 341/122 |
| 6,188,345 B1 | * | 2/2001 | McDonald et al. | 341/143 |
| 6,310,572 B1 | * | 10/2001 | Endo et al. | 341/156 |
| 6,420,983 B1 | * | 7/2002 | Feygin et al. | 341/118 |
| 6,429,904 B2 | * | 8/2002 | Sani et al. | 348/572 |
| 6,653,893 B2 | * | 11/2003 | Casper et al. | 330/9 |

* cited by examiner

*Primary Examiner*—Jean Bruner Jeanglaude

(57) ABSTRACT

An analog-to-digital converter includes a sample and hold tree having a first level and at least one additional level. Each level includes one or more sample and hold circuits operable to sample an input voltage and produce a corresponding output voltage. The input voltage sampled by the one or more sample and hold circuits in each additional level represents the output voltage from the one or more sample and hold circuits in a preceding level. The analog-to-digital converter also includes a plurality of comparators. Each comparator is operable to compare the output voltage from one of the sample and hold circuits with one of a plurality of reference voltages. In addition, the analog-to-digital converter includes a state machine operable to receive outputs from the comparators and generate a digital output value.

20 Claims, 6 Drawing Sheets

CIRCUIT, APPARATUS, AND METHOD FOR CONVERTING ANALOG SIGNALS INTO DIGITAL SIGNALS

TECHNICAL FIELD

The disclosure is generally directed to analog-to-digital converters and more specifically to a circuit, apparatus, and a method for converting analog signals to digital signals.

BACKGROUND

Analog-to-digital converters are often used to convert analog signals into digital signals. For example, wireless devices typically use analog-to-digital converters to convert analog wireless signals into digital signals suitable for processing. There are many different types of analog-to-digital converters, including flash converters, successive approximation register ("SAR") converters, and pipelined converters.

BRIEF DESCRIPTION OF THE DRAWINGS

For a more complete understanding of this disclosure and its features, reference is now made to the following description taken in conjunction with the accompanying drawings, in which.

DETAILED DESCRIPTION

Figure 1:
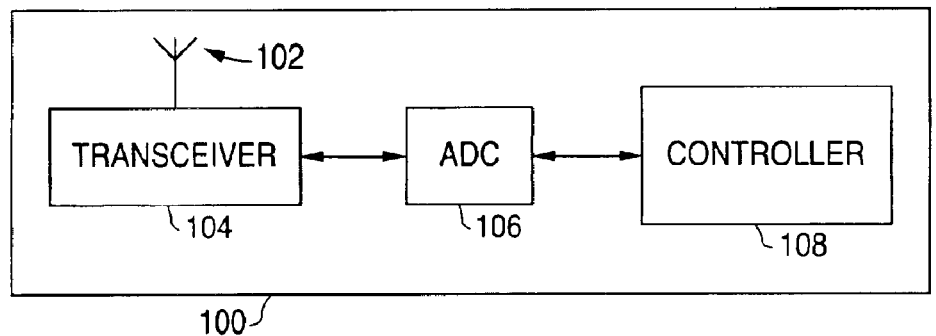
FIG. 1 is a block diagram illustrating an example communication device according to one embodiment of this disclosure.

FIG. 1 is a block diagram illustrating an example communication device 100 according to one embodiment of this disclosure. In this example, the communication device 100 includes an antenna 102, a transceiver 104, an analog-to-digital converter ("ADC") 106, and a controller 108. The communication device 100 illustrated in FIG. 1 is for illustration only. Other devices may be used without departing from the scope of this disclosure.

Conventional analog-to-digital converters often suffer from several drawbacks. For example, flash analog-to-digital converters often include circuits that provide higher input capacitance and that load the converter input. Also, flash analog-to-digital converters often toggle a large number of circuits during the conversion process, which increases the power used by the converters. Further, successive approximation register ("SAR") analog-to-digital converters are often much slower. In addition, SAR and pipelined analog-to-digital converters often involve an analog subtraction step, which may decrease the effectiveness of the converters.

In one aspect of operation, the communication device 100 includes one or more analog-to-digital converters 106. One embodiment of an analog-to-digital converter 106 is shown in FIGS. 2–5, which are described below. The analog-to-digital converter 106 disclosed in this specification may provide lower input capacitance, load, and power consumption than conventional flash analog-to-digital converters. Also, the analog-to-digital converter 106 disclosed in this specification may operate faster than conventional SAR analog-to-digital converters. In addition, the analog-to-digital converter 106 disclosed in this specification may not need to use an analog subtraction step, which may increase the effectiveness of the analog-to-digital converter 106.

In this example embodiment, the antenna 102 is coupled to the transceiver 104. In this document, the term "couple" and its derivatives refer to any direct or indirect communication between two or more elements, whether or not those elements are in physical contact with one another. The antenna 102 receives incoming signals for the communication device 100. The antenna 102 represents any suitable structure for receiving wireless signals, such as radio frequency ("RF") signals.

The transceiver 104 is coupled to the antenna 102 and the analog-to-digital converter 106. The transceiver 104 receives incoming signals through the antenna 102 and down-converts the incoming signals to produce baseband signals suitable for further processing. In this way, the transceiver 104 acts as an interface that provides analog signals to the analog-to-digital converter 106. The transceiver 104 represents any hardware, software, firmware, or combination thereof for processing incoming signals, such as a RF transceiver.

The analog-to-digital converter 106 is coupled to the transceiver 104 and the controller 108. The analog-to-digital converter 106 receives the baseband signals produced by the transceiver 104. The analog-to-digital converter 106 also converts the baseband signals from analog signals into digital signals. The analog-to-digital converter 106 includes any hardware, software, firmware, or combination thereof for converting analog signals into digital signals. One embodiment of the analog-to-digital converter 106 is shown in FIGS. 2–5, which are described below.

The controller 108 is coupled to the analog-to-digital converter 106. The controller 108 receives the digital signals produced by the analog-to-digital converter 106. The digital signals represent the incoming signals received by the antenna 102. The controller 108 processes the digital signals to perform any suitable function. For example, the controller 108 could use the digital signals to execute particular functions invoked by the incoming signals. The controller 108 includes any hardware, software, firmware, or combination thereof for processing digital signals.

While the communication device 100 has been described as receiving and processing incoming signals, the communication device 100 could represent a bi-directional device. For example, the transceiver 104 may receive and up-convert baseband signals into outgoing signals, which are transmitted by the antenna 102. The controller 108 could generate the baseband signals to be transmitted by the communication device 100.

Although FIG. 1 illustrates one example of a communication device 100, various changes may be made to FIG. 1. For example, the functional division in the communication device 100 of FIG. 1 is for illustration only. Other or additional components may be added and various components may be omitted according to particular needs. Also, FIG. 1 illustrates one operational environment for the analog-to-digital converter 106. The analog-to-digital converter 106 could be used in any other device or system.

Figure 2:
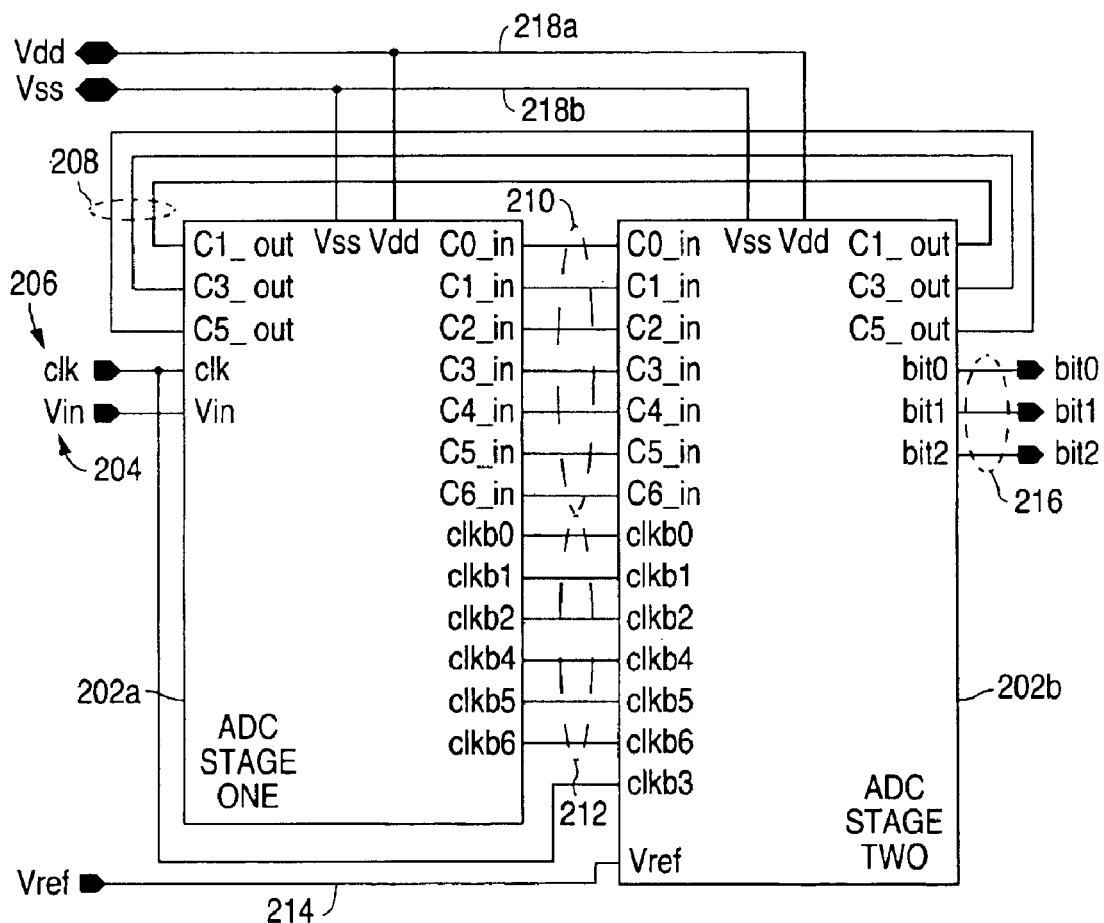
FIG. 2 is a block diagram illustrating an example multiple stage analog-to-digital converter according to one embodiment of this disclosure.

FIG. 2 is a block diagram illustrating an example multiple stage analog-to-digital converter 106 according to one embodiment of this disclosure. In this example, the analog-to-digital converter 106 includes two stages 202a and 202b. Other embodiments of the analog-to-digital converter 106 may be used without departing from the scope of this disclosure.

Figure 5:
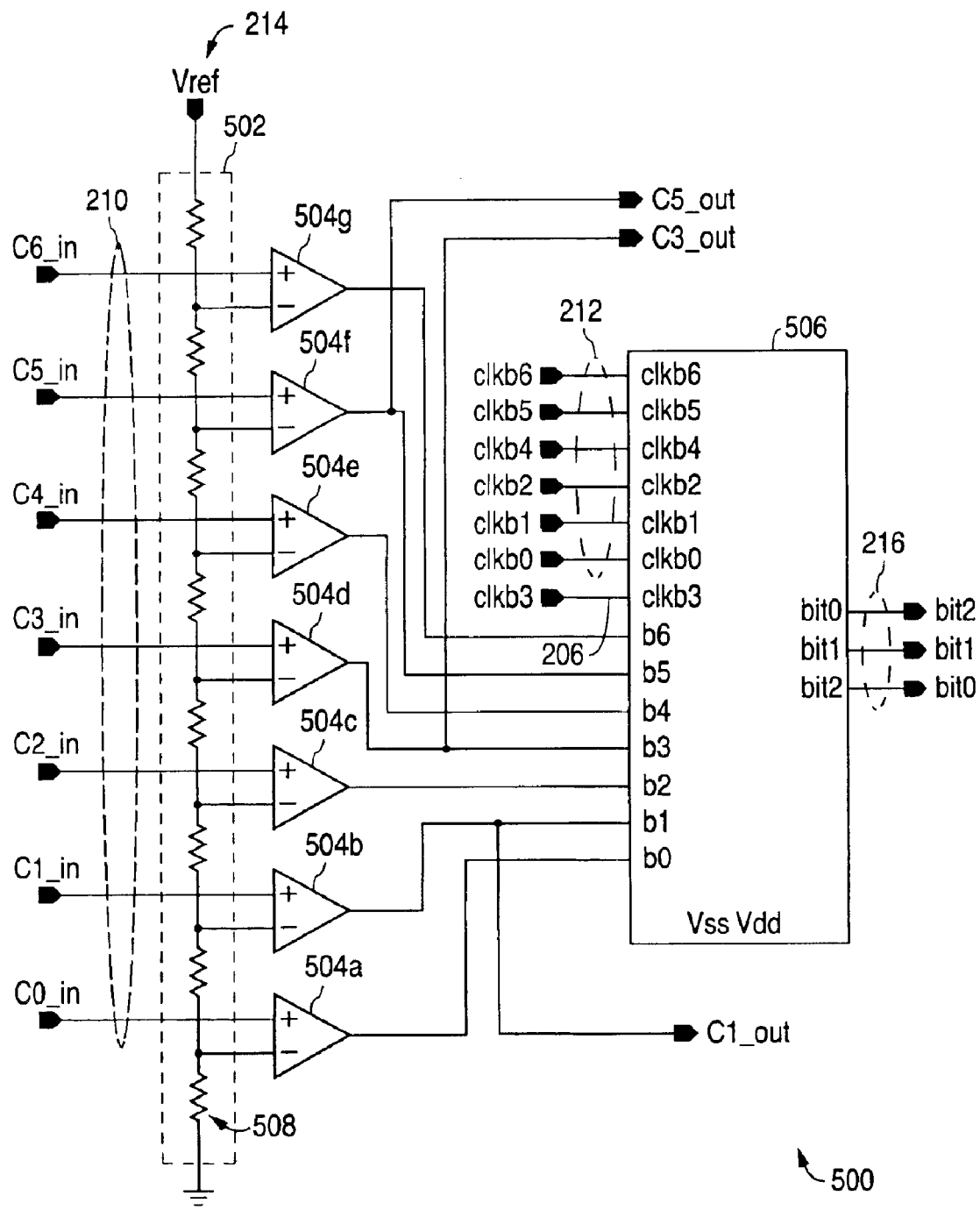
FIG. 5 is a block diagram illustrating an example second stage of an analog-to-digital converter according to one embodiment of this disclosure.

In this example, the first stage 202a receives an input voltage signal 204 and an input clock signal 206. The input voltage signal 204 may, for example, represent an analog signal provided by the transceiver 104 of FIG. 1 or any other suitable analog signal. The input clock signal 206 represents any suitable clock signal, such as a signal from a local oscillator or other clock signal. The first stage 202a also receives three output signals 208 produced by the second stage 202b. As shown in FIG. 5 and described below, the output signals 208 represent the outputs produced by three comparators in the second stage 202b.

Figure 3:
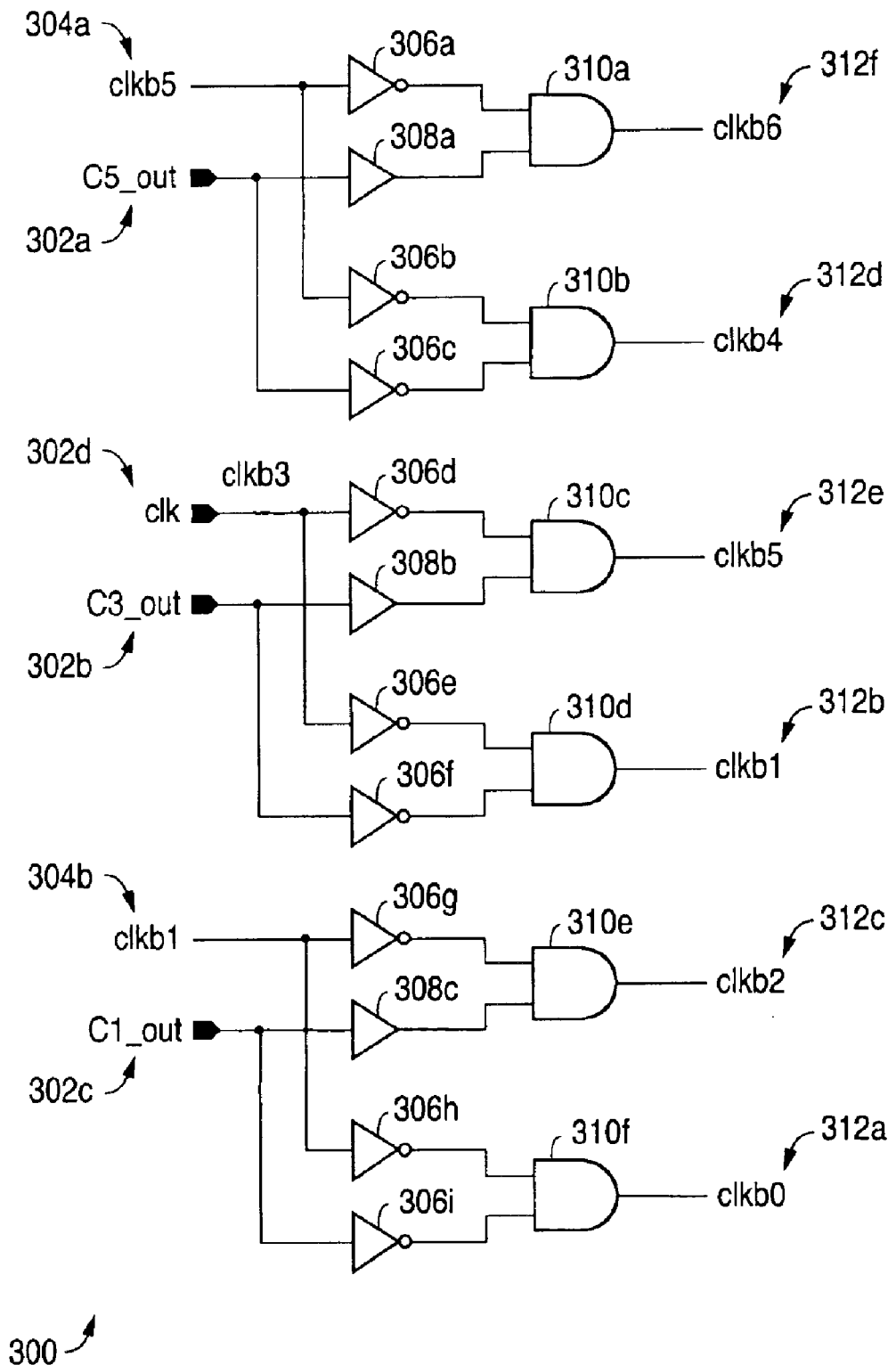
FIG. 3 is a block diagram illustrating a portion of an example first stage of an analog-to-digital converter according to one embodiment of this disclosure.
Figure 4:
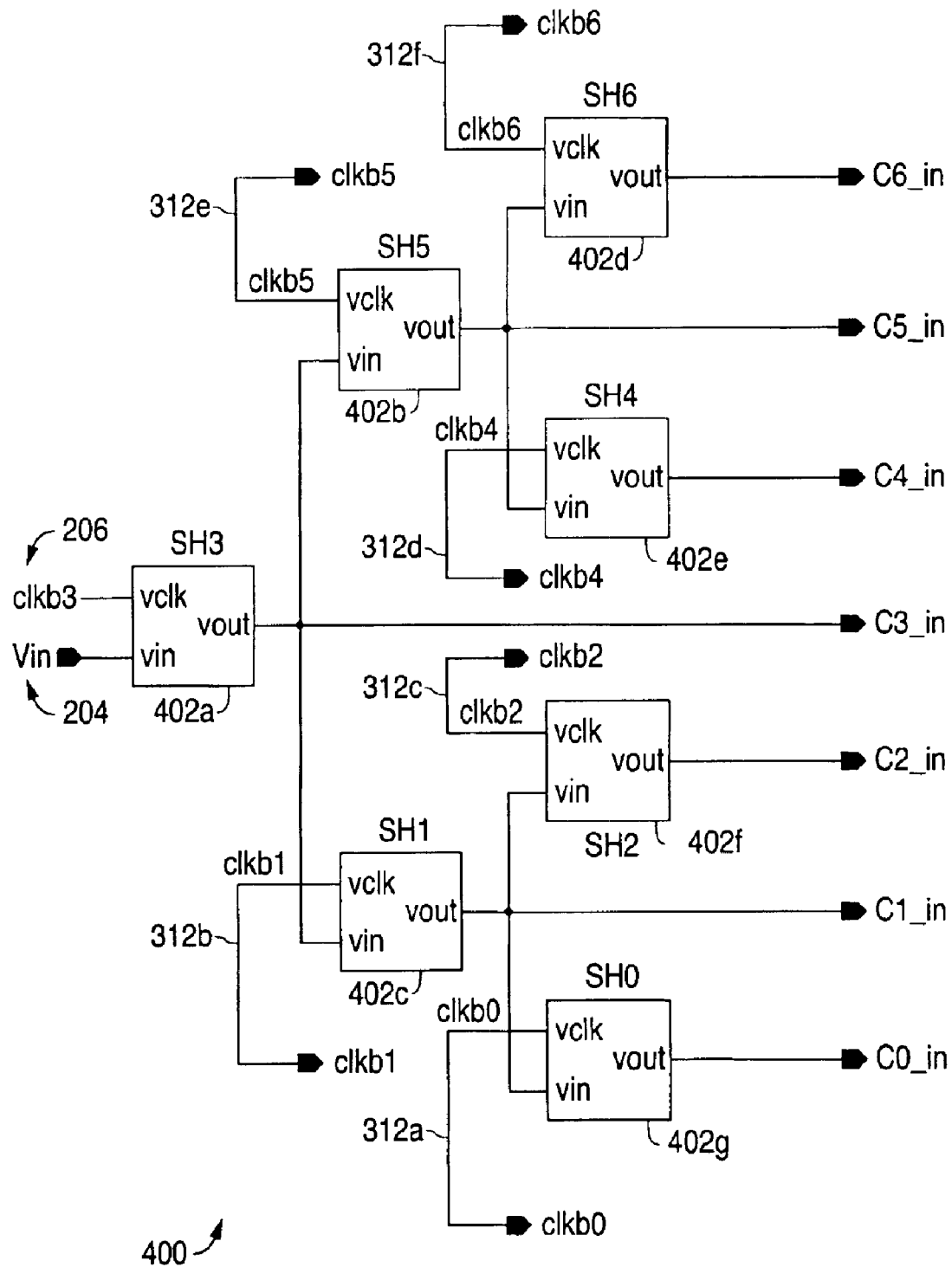
FIG. 4 is a block diagram illustrating another portion of an example first stage of an analog-to-digital converter according to one embodiment of this disclosure.

In this example, the first stage 202a produces seven sample and hold output signals 210 and six clock output signals 212. As shown in FIG. 4 and described below, the seven sample and hold output signals 210 represent outputs produced by seven sample and hold circuits in the first stage 202a. Also, as shown in FIG. 3 and described below, the six clock output signals 212 represent outputs produced by clock gating logic in the first stage 202a.

The various output signals 210, 212 produced by the first stage 202a are provided to the second stage 202b. The second stage 202b also receives the input clock signal 206 and a reference voltage signal 214. Using these signals, the second stage 202b produces the three output signals 208 and digital output values 216. Each digital output value 216 contains one or more bits that represent a voltage contained in the input voltage signal 204. In this example, each digital output value 216 contains three bits, although any number of bits may be used in the digital output values 216.

The two stages 202a and 202b are powered by two voltage rails 218a and 218b. For example, the first voltage rail 218a may provide a voltage of 2.5 volts or five volts, and the second voltage rail 218b may provide a voltage of zero volts. Any other suitable voltages may be used by the two stages 202a and 202b.

Although FIG. 2 illustrates one example of a multiple stage analog-to-digital converter 106, various changes may be made to FIG. 2. For example, the two stages 202a and 202b could be combined into one stage or further subdivided into additional stages.

FIG. 3 is a block diagram illustrating a portion of an example first stage 202a of an analog-to-digital converter 106 according to one embodiment of this disclosure. In particular, FIG. 3 illustrates clock gating logic 300 used in the first stage 202a of the analog-to-digital converter 106. The clock gating logic 300 shown in FIG. 3 is for illustration only. Other logic could be used in the analog-to-digital converter 106 or other converter without departing from the scope of this disclosure.

As shown in FIG. 3, the clock gating logic 300 includes four input ports 302a–302d. The input ports 302a–302c receive the three output signals 208 produced by the second stage 202b of the analog-to-digital converter 106. The fourth input port 302d receives the input clock signal 204. The clock gating logic 300 also receives two additional input signals 304a and 304b, which represent previous clock signals produced by the clock gating logic 300.

The clock gating logic 300 also includes inverters 306a–306i, buffers 308a–308c, and AND gates 310a–310f. The inverters 306a–306i, buffers 308a–308c, and AND gates 310a–310f are used to generate six clock signals 312a–312f. As described below, the six clock signals 312a–312f are used to control sample and hold circuits in the first stage 202a of the analog-to-digital converter 106. The six clock signals 312a–312f are also output as the six clock output signals 212, which are provided to the second stage 202b of the analog-to-digital converter 106.

The clock gating logic 300 shown in FIG. 3 may be implemented as hardware, software, firmware, or combination thereof. For example, the clock gating logic 300 may be implemented as complementary metal oxide semiconductor ("CMOS") gates, an application-specific integrated circuit ("ASIC"), a field-programmable gate array ("FPGA"), or a digital signal processor ("DSP").

Although FIG. 3 illustrates one example of the clock gating logic 300 in the first stage 202a of the analog-to-digital converter 106, various changes may be made to FIG. 3. For example, other logic that performs the same functions of the clock gating logic 300 could be used in the analog-to-digital converter 106.

FIG. 4 is a block diagram illustrating another portion of an example first stage 202a of an analog-to-digital converter 106 according to one embodiment of this disclosure. In particular, FIG. 4 illustrates a sample and hold tree 400 used in the first stage 202a of the analog-to-digital converter 106. The logic shown in FIG. 4 is for illustration only. Other logic could be used in the analog-to-digital converter 106 or other converter without departing from the scope of this disclosure.

As shown in FIG. 4, the sample and hold tree 400 includes seven sample and hold circuits 402a–402g. Each of the sample and hold circuits 402a–402g is capable of receiving an input voltage and a clock signal. When toggled by the clock signal, each of the sample and hold circuits 402a–402g provides the input voltage as an output voltage.

In this example embodiment, the sample and hold circuits 402a–402g are arranged in a tree structure. The tree structure has multiple levels, specifically a first level on the left, a second level in the middle, and a third level on the right. In some embodiments, moving from left to right in the sample and hold tree 400, each level (except the first level) includes more sample and hold circuits 402 than the preceding level. In particular embodiments, each level (except the first level) includes twice the number of sample and hold circuits 402 than the preceding level.

The sample and hold circuit 402a in the first level receives the input voltage signal 204 and the input clock signal 206. The sample and hold circuit 402a in the first level samples the input voltage signal 204 and produces an output signal. This output signal is provided as an input signal to the second level of sample and hold circuits 402b–402c. The sample and hold circuits 402b–402c also receive the clock signals 312b and 312e produced by the clock gating logic 300. One of the sample and hold circuits 402b–402c in the second level samples the input signal (the output from the sample and hold circuit 402a) and produces an output signal. This output signal is provided as an input signal to the third level of sample and hold circuits 402d–402g. The sample and hold circuits 402d–402g also receive the clock signals 312a, 312c, 312d, and 312f produced by the clock gating logic 300. One of the sample and hold circuits 402d–402g in the third level samples the input signal (the output from one of the sample and hold circuits 402b–402c) and produces an output signal.

As described above, only one of the sample and hold circuits 402 in each level of the sample and hold tree 400 is allowed to sample an input voltage. Also, the sample and hold circuit 402a in the first level receives the input voltage signal 204, and each sample and hold circuit 402 in the other levels receives the output of a preceding level as an input.

The output signals from the sample and hold circuits 402a–402g are output as the seven sample and hold output signals 210, which are provided to the second stage 202b of the analog-to-digital converter 106. Also, the clock signals 312a–312f received by the sample and hold circuits 402a–402g are output as the six clock output signals 212, which are provided to the second stage 202b of the analog-to-digital converter 106. These output signals 210, 212 are used by the second stage 202b of the analog-to-digital converter 106 to generate digital bits representing the input voltage signal 204.

The sample and hold tree 400 shown in FIG. 4 may be implemented as hardware, software, firmware, or combination thereof. For example, the sample and hold circuits 402a–402g may be implemented as flip-flops, an ASIC, a FPGA, or a DSP.

Although FIG. 4 illustrates one example of a sample and hold tree 400 used in the first stage 202a of the analog-to-digital converter 106, various changes may be made to FIG. 4. For example, the sample and hold tree 400 could include any number of levels and/or any number of sample and hold circuits 402.

FIG. 5 is a block diagram illustrating an example second stage 202b of an analog-to-digital converter 106 according to one embodiment of this disclosure. The logic shown in FIG. 5 is for illustration only. Other logic could be used in the analog-to-digital converter 106 or other converter without departing from the scope of this disclosure.

As shown in FIG. 5, the second stage 202b of the analog-to-digital converter 106 includes a reference voltage ladder 502, comparators 504a–504g, and a state machine 506. The reference voltage ladder 502 includes multiple resistors 508. The reference voltage ladder 502 receives the reference voltage signal 214 and generates different reference voltages between the resistors 508. In this example, the reference voltages decrease as the reference voltage signal 214 moves down the reference voltage ladder 502 toward a ground.

The reference voltage ladder 502 may include any suitable number of resistors 508, and the resistors 508 may have any suitable resistance or resistances. In particular embodiments, each resistor 508 represents a one mega-ohm resistor. Also, the reference voltage ladder 502 could include $2^n$ resistors 508, where n represents the number of bits in each digital output value 216 produced by the state machine 506.

The comparators 504a–504g receive the sample and hold output signals 210 from the sample and hold circuits 402a–402g and reference voltages from the reference voltage ladder 502. Each of the comparators 504a–504g generates an output based on a comparison between one of the sample and hold output signals 210 and one of the reference voltages. The outputs from the comparators 504a–504g are provided to the state machine 506. The outputs from the comparators 504b, 504d, and 504f are also provided to the first stage 202a of the analog-to-digital converter 106 as the output signals 208.

Each of the comparators 504a–504g represents any hardware, software, firmware, or combination thereof for comparing two inputs. Also, the second stage 202b may include any number of comparators. In particular embodiments, the second stage 202b includes $2^n-1$ comparators, where n represents the number of bits in each digital output value 216 produced by the state machine 506.

The state machine 506 receives the outputs from the comparators 504a–504g, the six clock output signals 212, and the input clock signal 206. The state machine 506 uses these values to produce the digital output values 216. In some embodiments, the state machine 506 generates or resolves one bit of a digital output value 216 per cycle of the input clock signal 206. The state machine 506 includes any hardware, software, firmware, or combination thereof for generating digital output values. For example, in some embodiments, the state machine 506 is implemented as an encoder.

In one aspect of operation, the input voltage signal 204 and the input clock signal 206 are provided to the sample and hold circuit 402a in FIG. 4. The sample and hold circuit 402a generates an output voltage, which is received by the comparator 504d. The comparator 504d generates an output, which represents the most significant bit in a digital output value 216.

Depending on the value of the most significant bit, during the next clock cycle, one of the sample and hold circuits 402b–402c in the second level of the tree 400 receives and samples an input voltage (the output of the first sample and hold circuit 402a) and generates an output voltage. The output voltage is. received by one of the comparators 504b or 504f, which generates an output that represents the next most significant bit in a digital output value 216.

Depending on the value of the next most significant bit, during a third clock cycle, one of the sample and hold circuits 402d–402g in the third level of the tree 400 receives and samples an input voltage (the output of one of the sample and hold circuits 402b–402c) and generates an output voltage. The output voltage is received by one of the comparators 504a, 504c, 504e, 504g, which generates an output that represents the least significant bit of a digital output value 216.

In this example, the value of the most significant bit in a digital output value 216 controls which sample and hold circuit 402b–402c in the second level of the tree 400 samples the input voltage. Similarly, the value of the next most significant bit in a digital output value 216 controls which sample and hold circuit 402d–402g in the third level of the tree 400 samples the input voltage. This process continues until the least significant bit in a digital output value 216 is produced. As shown in FIGS. 3 and 5, this functionality is supported by the clock gating logic 300, which uses the output signals 208 from certain comparators 502b, 502d, 502f to generate the clock signals 212. These clock signals 212 allow only one sample and hold circuit 402 in each level of the tree 400 to sample an input voltage.

The state machine 506 receives the outputs produced by the comparators 504a–504g and the various clock signals 206, 212. The state machine 506 generates a digital output value 216 based on the comparator outputs and the clock signals 206, 212. For example, the state machine 506 uses the output of the comparator 504d as the most significant bit (bit2) in the digital output value 216. Using the clock signals 212, the state machine 506 identifies the output of either the comparator 504b or the comparator 504f as the next most significant bit (bit1) in the digital output value 216. Finally, using the clock signals 212, the state machine 506 identifies the output of one of the comparators 504a, 504c, 504e, 504g as the least significant bit (bit0) in the digital output value 216.

In this way, the state machine 506 generates one bit of a digital output value 216 during each clock cycle. Also, the sample and hold tree 400 may be processing multiple voltages of the input voltage signal 204 at the same time. For example, once a first voltage has been provided to the third level of sample and hold circuits 402d–402g, a second voltage may be provided to the first sample and hold circuit 402a.

The analog-to-digital converter 106 shown in FIGS. 2–5 has a lower input capacitance since the input voltage signal 204 may be provided to one of the sample and hold circuits 402a–402g at any instant. Also, the analog-to-digital converter 106 has a lower load on the input voltage signal 204 because the input voltage signal 204 need not be provided to $2^{n}31$ 1 comparators 504a–504g at the same time. Further, through the use of the clock gating logic 300, at most n (the number of bits in a digital output value 216) of the comparators 504a–504g toggle during a single clock cycle, which reduces the power consumed by the analog-to-digital converter 106. In addition, the analog-to-digital converter 106 may be faster than conventional SAR converters and does not require an analog subtraction step.

Although FIG. 5 illustrates one example of the second stage 202b of an analog-to-digital converter 106, various changes may be made to FIG. 5. For example, the second stage 202b may include any number of comparators 504. Also, the state machine 506 may produce digital output values 216 with any number of bits.

FIGS. 6A through 6E are timing diagrams illustrating the operation of an analog-to-digital converter 106 according to one embodiment of this disclosure. The timing diagrams shown in FIGS. 6A through 6E are for illustration only. Other timing diagrams could represent the operation of the analog-to-digital converter 106 without departing from the scope of this disclosure.

Figure 6A:
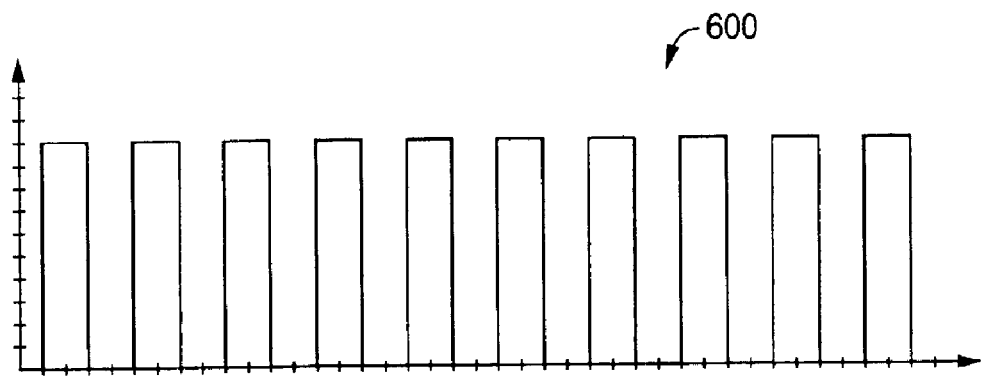
FIGS. 6A through 6E are timing diagrams illustrating the operation of an analog-to-digital converter according to one embodiment of this disclosure.
Figure 6B:
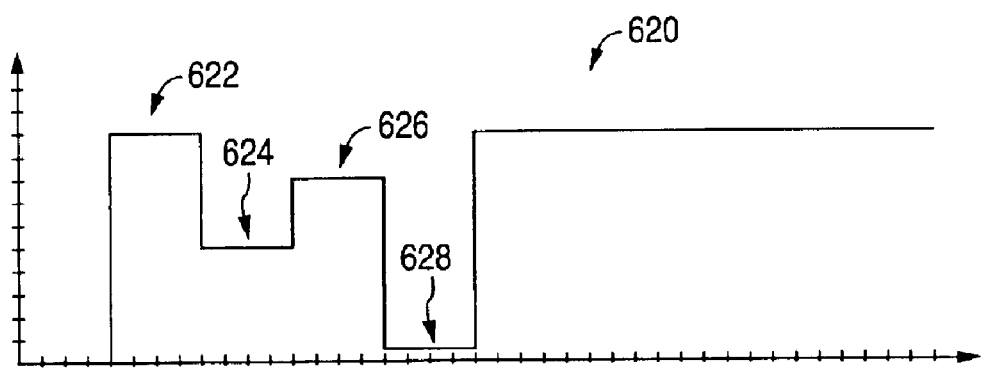

FIG. 6A illustrates a timing diagram 600 that represents the input clock signal 206, and FIG. 6B illustrates a timing diagram 620 that represents the input voltage signal 204. As shown in FIG. 6B, the input voltage signal 204 varies and includes different voltages 622–628.

Figure 6C:
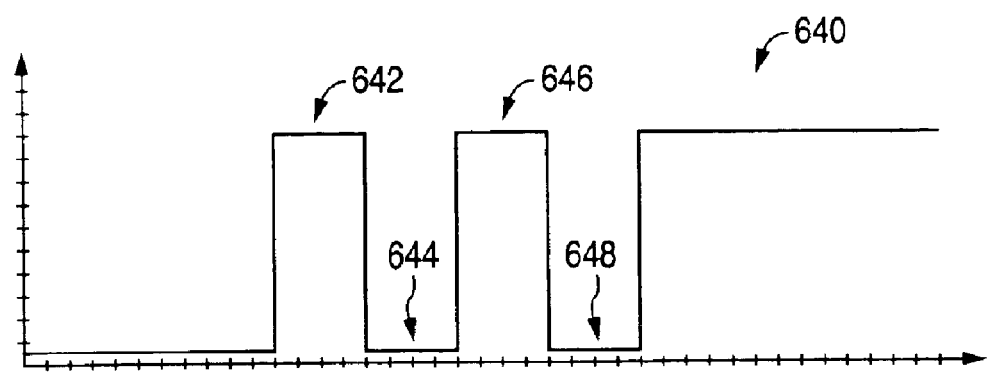
Figure 6D:
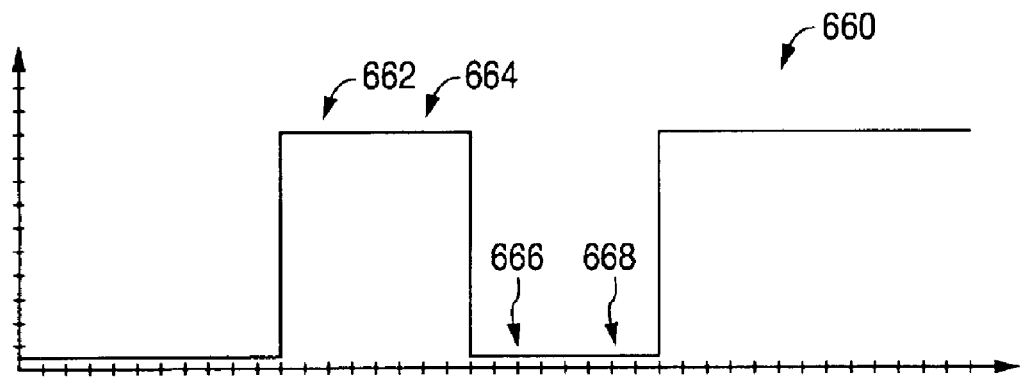
Figure 6E:
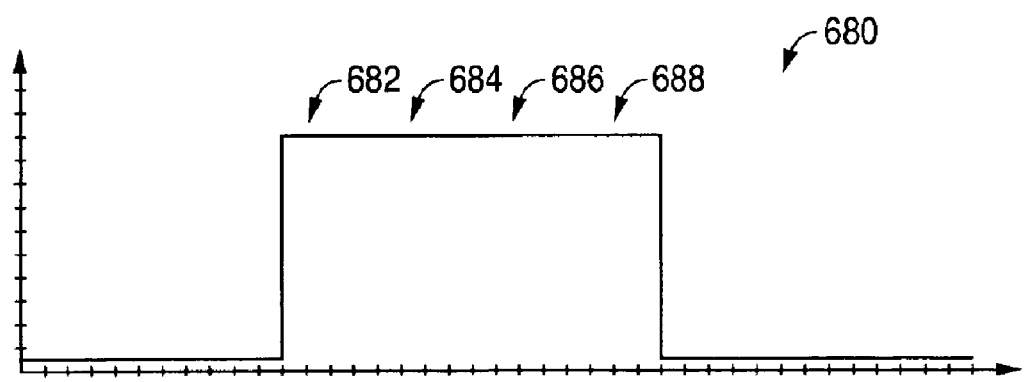

FIG. 6C illustrates a timing diagram 640 that represents the value of the most significant bit (bit2) in the digital output values 216 produced by the analog-to-digital converter 106. FIG. 6D illustrates a timing diagram 660 that represents the value of the next most significant bit (bit1) in the digital output values 216. FIG. 6E illustrates a timing diagram 680 that represents the value of the least significant bit (bit0) in the digital output values 216 produced by the analog-to-digital converter 106.

As shown in FIGS. 6C through 6E, the voltages 642, 662, and 682 represent the output bits corresponding to the voltage 622 in the input voltage signal 204. Similarly, the voltages 644, 664, and 684 represent the output bits corresponding to the voltage 624 in the input voltage signal 204. The voltages 646, 666, and 686 represent the output bits corresponding to the voltage 626 in the input voltage signal 204. Finally, the voltages 648, 668, and 688 represent the output bits corresponding to the voltage 628 in the input voltage signal 204.

In this example, the voltage 622 is represented as a "111" digital output value 216, and the voltage 624 is represented as a "011" digital output value 216. Similarly, the voltage 626 is represented as a "101" digital output value 216, and the voltage 628 is represented as a "001" digital output value 216.

As shown in FIGS. 6A through 6E, the digital output value 216 representing the voltage 622 is produced 1.5 clock cycles after the voltage 622 is received. In the illustrated example, this indicates that the analog-to-digital converter 106 has a latency of 1.5 clock cycles. Also, the analog-to-digital converter 106 resolves one bit of a digital output value 216 during each clock cycle. In the illustrated example, this indicates that the analog-to-digital converter 106 has a one cycle throughput.

Although FIGS. 6A through 6E illustrate example timing diagrams representing the operation of an analog-to-digital converter 106, various changes may be made to FIGS. 6A through 6E. For example, the input voltage signal 204 represented by the timing diagram 620 could have any suitable form.

It may be advantageous to set forth definitions of certain words and phrases that have been used within this patent document. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. The term "controller" means any device, system, or part thereof that controls at least one operation. A controller may be implemented in hardware, software, firmware, or combination thereof. It should be noted that the functionality associated with any particular controller may be centralized or distributed, whether locally or remotely.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the

What is claimed is:

1. An analog-to-digital converter, comprising:
   a sample and hold tree comprising a first level and at least one additional level, each level comprising one or more sample and hold circuits operable to sample an input voltage and produce a corresponding output voltage, wherein the input voltage sampled by the one or more sample and hold circuits in each additional level comprises the output voltage from the one or more sample and hold circuits in a preceding level;
   a plurality of comparators, each comparator operable to compare the output voltage from one of the sample and hold circuits with one of a plurality of reference voltages; and
   a state machine operable to receive outputs from the comparators and generate a digital output value.

2. The analog-to-digital converter of claim 1, wherein:
   the first level of the sample and hold tree comprises a single sample and hold circuit; and
   a first bit in the digital output value is based on the output of the comparator associated with the sample and hold circuit in the first level.

3. The analog-to-digital converter of claim 2, wherein:
   the at least one additional level comprises a second level having two sample and hold circuits, wherein only one of the two sample and hold circuits samples the input voltage to produce the output voltage; and
   a second bit in the digital output value is based on the output of the comparator associated with the sample and hold circuit in the second level that samples the input voltage.

4. The analog-to-digital converter of claim 3, wherein:
the at least one additional level further comprises a third level having four sample and hold circuits, wherein only one of the four sample and hold circuits samples the input voltage to produce the output voltage; and
a third bit in the digital output value is based on the output of the comparator associated with the sample and hold circuit in the third level that samples the input voltage.

5. The analog-to-digital converter of claim 1, wherein each additional level of the sample and hold tree comprises more sample and hold circuits than the preceding level of the sample and hold tree.

6. The analog-to-digital converter of claim 5, further comprising clock gating logic operable to receive an input clock signal and generate at least one additional clock signal; and
wherein, based on the input clock signal and the at least one additional clock signal, only one sample and hold circuit in each level of the sample and hold tree samples the input voltage for each cycle of the input clock signal.

7. The analog-to-digital converter of claim 1, further comprising a reference voltage ladder operable to produce the plurality of reference voltages.

8. The analog-to-digital converter of claim 1, wherein the state machine comprises an encoder.

9. The analog-to-digital converter of claim 1, wherein:
the state machine produces an n-bit digital output value; and
the plurality of comparators comprises $2^n-1$ comparators.

10. The analog-to-digital converter of claim 1, wherein the state machine is operable to resolve one bit of the digital output value for each cycle of an input clock signal.

11. An apparatus, comprising:
an interface operable to receive an incoming signal; and
an analog-to-digital converter comprising:
a sample and hold tree comprising a first level and at least one additional level, each level comprising one or more sample and hold circuits operable to sample an input voltage and produce a corresponding output voltage, wherein the input voltage sampled by the one or more sample and hold circuits in the first level comprises the incoming signal, and wherein the input voltage sampled by the one or more sample and hold circuits in each additional level comprises the output voltage from the one or more sample and hold circuits in a preceding level;
a plurality of comparators, each comparator operable to compare the output voltage from one of the sample and hold circuits with one of a plurality of reference voltages; and
a state machine operable to receive outputs from the comparators and generate a digital output value corresponding to the incoming signal.

12. The apparatus of claim 11, wherein:
the first level of the sample and hold tree comprises a single sample and hold circuit; and
a first bit in the digital output value is based on the output of the comparator associated with the sample and hold circuit in the first level.

13. The apparatus of claim 12, wherein:
the at least one additional level comprises a second level having two sample and hold circuits, wherein only one of the two sample and hold circuits samples the input voltage to produce the output voltage; and
a second bit in the digital output value is based on the output of the comparator associated with the sample and hold circuit in the second level that samples the input voltage.

14. The apparatus of claim 13, wherein:
the at least one additional level further comprises a third level having four sample and hold circuits, wherein only one of the four sample and hold circuits samples the input voltage to produce the output voltage; and
a third bit in the digital output value is based on the output of the comparator associated with the sample and hold circuit in the third level that samples the input voltage.

15. The apparatus of claim 14, wherein:
the analog-to-digital converter further comprises clock gating logic operable to receive an input clock signal and generate at least one additional clock signal; and
based on the input clock signal and the at least one additional clock signal, only one sample and hold circuit in each level of the sample and hold tree samples the input voltage for each cycle of the input clock signal.

16. The apparatus of claim 11, wherein the analog-to-digital converter further comprises a reference voltage ladder operable to produce the plurality of reference voltages.

17. The apparatus of claim 11, wherein:
the state machine produces an n-bit digital output value;
the plurality of comparators comprise $2_n-1$ comparators; and
the state machine is operable to resolve one bit of the digital output value for each cycle of an input clock signal.

18. A method, comprising:
sampling an input voltage to produce a first output voltage using a first sample and hold circuit;
comparing the first output voltage to a first threshold to identify a first bit of a digital value;
sampling the input voltage to produce a second output voltage using one of a plurality of second sample and hold circuits, the second sample and hold circuit selected based on the first bit; and
comparing the second output voltage to a second threshold to identify a second bit of the digital value.

19. The method of claim 18, further comprising:
sampling the input voltage to produce a third output voltage using one of a plurality of third sample and hold circuits, the third sample and hold circuit selected based on the second bit; and
comparing the third output voltage to a third threshold to identify a third bit of the digital value.

20. The method of claim 18, wherein:
the plurality of second sample and hold circuits comprise two sample and hold circuits; and
the plurality of the third sample and hold circuits comprise four sample and hold circuits.

* * * * *

UNITED STATES PATENT AND TRADEMARK OFFICE
CERTIFICATE OF CORRECTION

PATENT NO. : 6,919,831 B1
DATED : July 19, 2005
INVENTOR(S) : Madhavi V. Tagare

It is certified that error appears in the above-identified patent and that said Letters Patent is hereby corrected as shown below:

Column 7,
Line 15, delete "$2^n 31\ 1$" and insert -- $2^n-1$ --; and

Column 10
Line 33, delete "$2_n-1$" and insert -- $2^n-1$ --.

Signed and Sealed this

Eighth Day of November, 2005

JON W. DUDAS
*Director of the United States Patent and Trademark Office*